United States Patent
Aton

(10) Patent No.: US 7,927,782 B2
(45) Date of Patent: Apr. 19, 2011

(54) SIMPLIFIED DOUBLE MASK PATTERNING SYSTEM

(75) Inventor: Thomas John Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 391 days.

(21) Appl. No.: 11/966,819

(22) Filed: Dec. 28, 2007

(65) Prior Publication Data

US 2009/0169832 A1    Jul. 2, 2009

(51) Int. Cl.
G03F 7/00 (2006.01)
G03F 1/00 (2006.01)
G03C 5/00 (2006.01)

(52) U.S. Cl. .............................. 430/313; 430/5; 430/394

(58) Field of Classification Search ........ 430/5, 311–314, 430/394; 438/197, 528, 717
See application file for complete search history.

(56) References Cited

U.S. PATENT DOCUMENTS

| | | | |
|---|---|---|---|
| 6,492,073 B1 * | 12/2002 | Lin et al. | 430/5 |
| 6,969,580 B2 * | 11/2005 | Minami | 430/313 |
| 7,208,423 B2 * | 4/2007 | Hashimoto et al. | 438/717 |
| 7,662,718 B2 * | 2/2010 | Abatchev et al. | 438/689 |
| 7,759,253 B2 * | 7/2010 | Chang | 438/706 |
| 7,829,246 B2 * | 11/2010 | Kawakami | 430/5 |
| 7,862,988 B2 * | 1/2011 | Koh et al. | 430/314 |
| 7,867,693 B1 * | 1/2011 | Mieher | 430/317 |
| 2002/0160590 A1 * | 10/2002 | Hashimoto et al. | 438/528 |

* cited by examiner

*Primary Examiner* — Stephen Rosasco
*Assistant Examiner* — Stewart A Fraser
(74) *Attorney, Agent, or Firm* — Warren L. Franz; Wade J. Brady, III; Frederick J. Telecky, Jr.

(57) ABSTRACT

One embodiment of the present invention relates to a method for which a two mask lithography process can be used to reduce design density. The two mask process uses a first mask to expose a first photoresist layer located above a hard mask layer. The first photoresist is exposed in such a way that the level forms one or more lines, on opposite sides of a cell boundary. The hard mask is then etched. A second photoresist layer is deposited above the hard mask. The second mask is used to expose the second photoresist layer in such a way that a space is formed along the cell boundary equal to the minimum space of the level as required by the design rules. The hard mask is then etched again. The hard mask is subsequently used to pattern the layer below it. Other methods and structures are also disclosed.

7 Claims, 12 Drawing Sheets

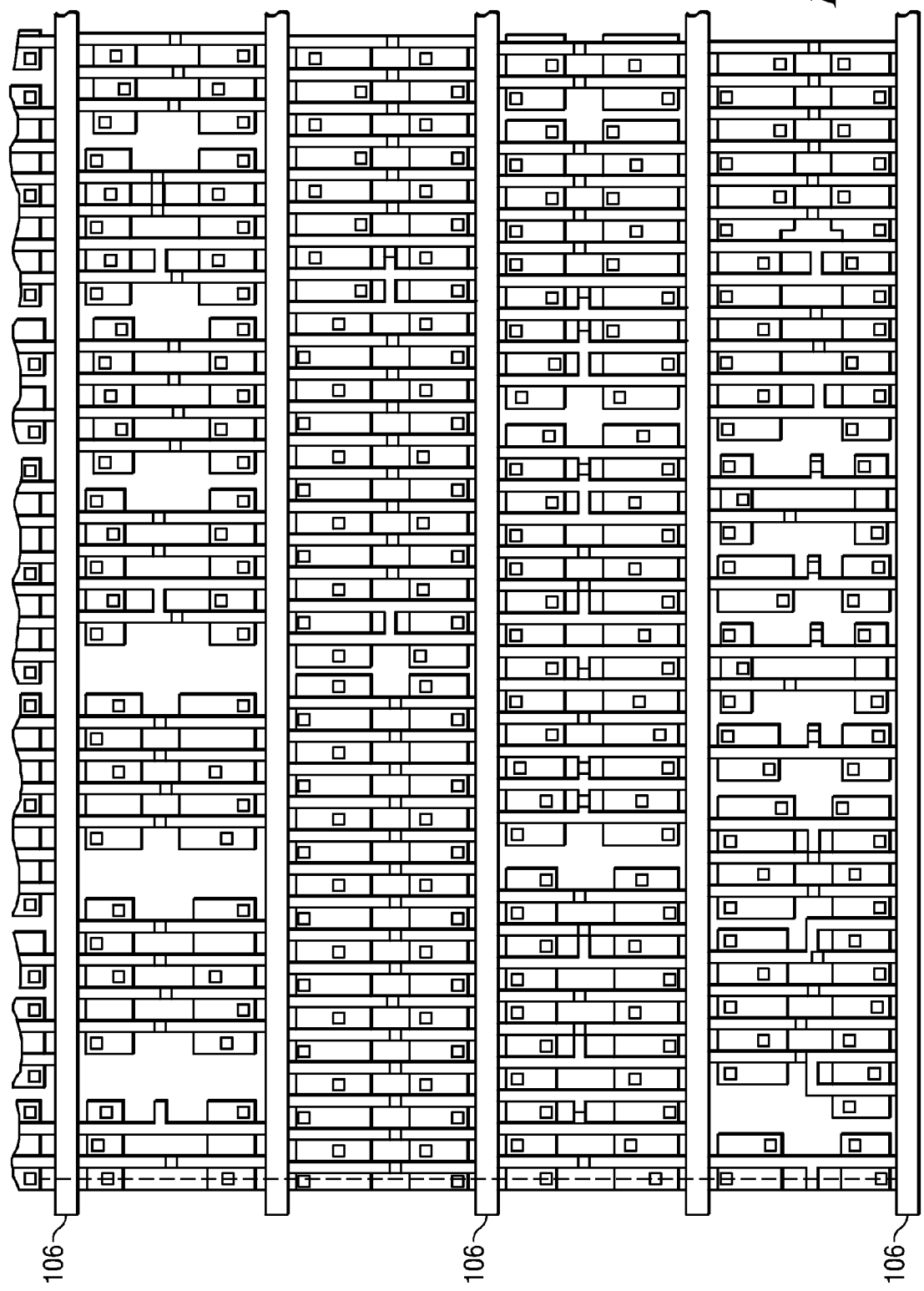

SIMPLIFIED DOUBLE MASK PATTERNING SYSTEM

FIELD OF INVENTION

The present invention relates generally to semiconductor device fabrication and more particularly to a method for reducing the area of random logic designs.

BACKGROUND OF THE INVENTION

Over the course of its life, the semiconductor industry has relied upon a strategy of scaling down the feature size of integrated chip components to improve speed and functionality of integrated chips. For many years the industry continued to fabricate decreased design sizes through decreasing the wavelength of the illumination source used for lithography. In recent years however, tool vendors have been unable to decrease the wavelength of illuminations sources and developing technology nodes now have minimum feature sizes of 20% or less than the wavelength of illumination used in exposure tools. While resolution enhancement techniques, such as immersion lithography, have allowed continued scaling through the 45 nm technology node, the need to reduce design area through non-traditional innovation has become increasingly important.

As difficult as it is to produce the minimum feature size in random logic circuits, statistical random access memory (SRAM) cells have pushed for even smaller feature size and higher density, often resulting in chips with sub-minimum design rule content. They are able to do this due to the repetitive nature of SRAM designs. SRAM designs comprise the same SRAM cell repeated over and over again throughout the SRAM design area. Since the same design is printed many times on a substrate lithography tools can be tuned to print the pitches associated with SRAM cells improving tool performance specifically for those cells.

In developing technologies, further improvement of design density for SRAM cells is also planned through exploitation of the cell edges. This is done with a two mask lithography process per layer. Such methods have been avoided in random logic fabrication since they require a data partition that is restrictive and difficult to perform.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a method for increasing the design density of an integrated chip. In this embodiment a hard mask is deposited above a gate electrode layer. A first photoresist is formed on the hard mask. A first mask is used to expose the first photoresist layer in such a way that the level forms two or more lines, on opposite sides of a cell boundary. The hard mask is then etched and the first photoresist is removed. A second photoresist layer is formed on the hard mask. A second mask is used to expose the second photoresist layer in such a way that a space is formed along the cell boundary equal to the minimum space of the level as required by the design rules. The hard mask is etched again and the second photoresist is removed. The gate electrode layer is etched with the patterning of the hard mask. Finally, the hard mask is removed and additional process steps ensue. Other embodiments and methods are also disclosed.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 1B shows a screenshot of a larger section of the IC layout of FIG. 1A;

DETAILED DESCRIPTION OF THE INVENTION

Figure 1A:
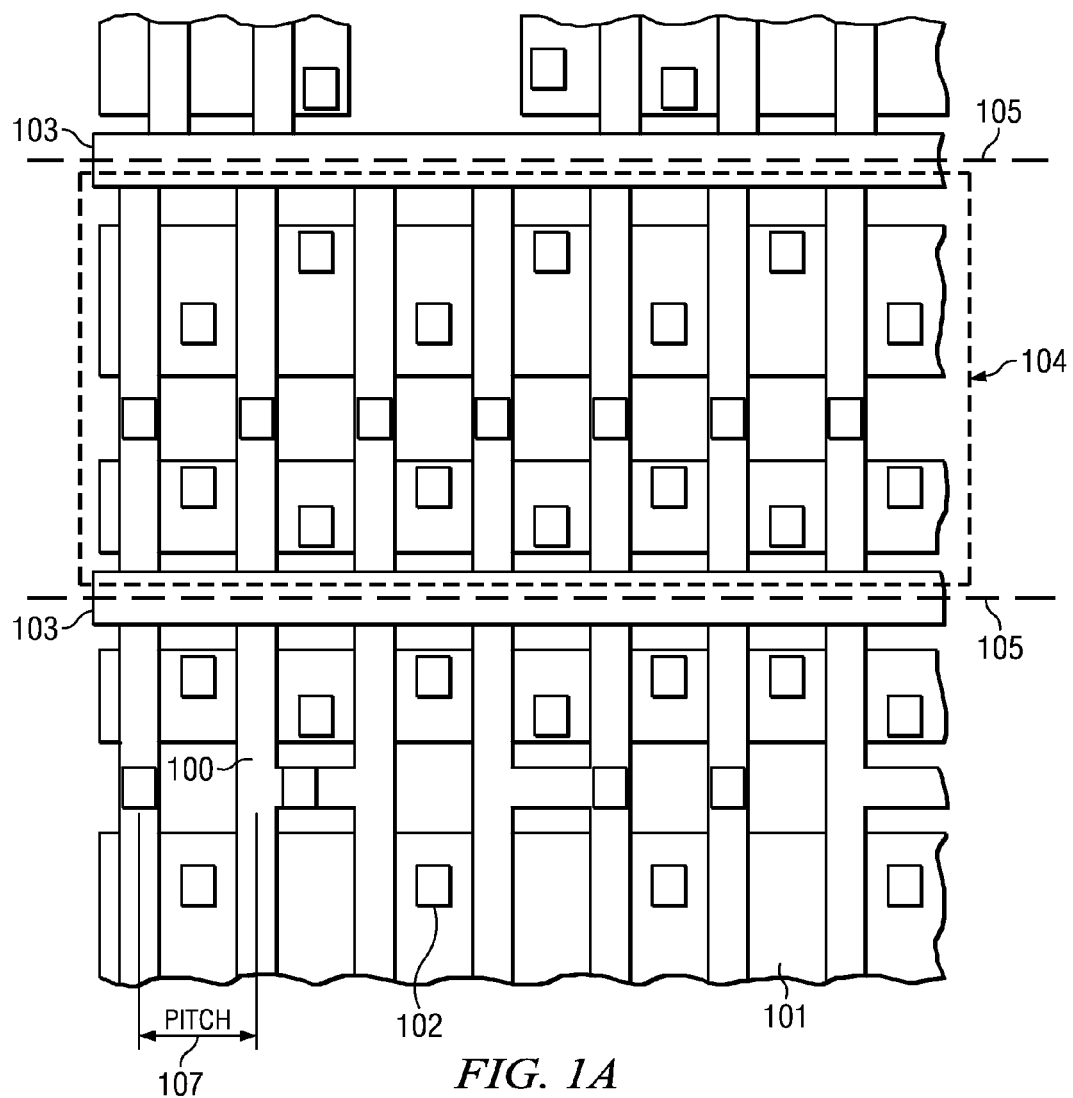
FIG. 1A shows an exemplary integrated chip (IC) layout comprising an active layer, a gate electrode layer, a contact layer, and mask cuts of a second mask.

The present invention will now be described with reference to the attached drawing figures, wherein like reference numerals are used to refer to like elements throughout, and wherein the illustrated structures and devices are not necessarily drawn to scale.

In the examples of this disclosure, the dimensions disclosed for gate width, as well as any other pattern dimensions disclosed herein unless otherwise expressly stated, are based upon the size of the pattern to be formed on the wafer. The actual dimensions for gate width for the photomask patterns will vary depending upon the size of the reduction factor of the photomask. Photomasks are often formed to have, for example, a 4× or 5× reduction factor, meaning that the photomask pattern dimensions can be about 4 or 5 times larger than the corresponding dimensions formed on the wafer.

Similarly, the dimensions of the drawn pattern may or may not also have a reduction factor. Therefore, as one of ordinary skill in the art would readily understand, the mask sizes and the drawn pattern sizes can correspond to the wafer dimensions based on any suitable reduction factor, including where the dimensions on the mask and/or drawn pattern dimensions are intended to be the same as those formed on the wafer Silicon wafers produced in modern day fabrication facilities contain a large number of integrated chips per wafer. Each integrated chip is composed of many small parts designed by many different designers. Each of these parts is called a standard cell. Standard cells are the building blocks of integrated chips. They are pieced together, as needed, to create higher level random logic designs or memory cells. For example, a standard cell may consist of a NAND gate. On a low level the NAND gate will comprise a specific configuration of well implants, an active level, a gate electrode level, etc., the design of which is relatively complicated. But, once a NAND gate is designed it can be placed in a standard cell and then repeatedly used throughout an integrated chip design allowing complex chips to be designed in a much easier fashion.

FIG. 1A shows an exemplary integrated chip layout. A gate electrode layer 100, an active layer 101, and a contact layer 102 are visible in the layout. The integrated chip of FIG. 1A is an example of a chip layout comprised of standard cells. A standard cell 104 is shown along with a border region 103 located along the cell boundary 105. The term border region as used in this disclosure refers to the area designed between two sets of at least three parallel conductive lines. For example, in FIG. 1A, two sets of at least three gates are drawn above and below the top and bottom border regions located between them. In this example, the border region also happens to be along the cell boundary, though this is not necessarily true in all cases. In another example, the border region is equally spaced between active regions located below three or more gate electrode lines.

FIG. 1A also illustrates the important concept of pitch. For simple line/space geometries, pitch can be defined as the sum of the width of a line and the space between the line and an adjacent line, where the width is the smaller dimension of the line. FIG. 1A shows the pitch 107 between two gate electrode lines. Minimum contacted pitch is a special case of pitch. Minimum contacted pitch is defined as the centerline-to-centerline distance between two minimum sized gates (e.g., as defined by technology ground rules) that have a single contact placed between the two gates.

FIG. 1B shows a screenshot of a larger portion of the integrated chip layout of FIG. 1A. This screenshot can be used to further illustrate a principal feature of the present invention, the use of mask cuts 106 to decrease design area. The screenshott of FIG. 1B comprises a number of adjacent standard cells. Each standard cell is separated by a border region (not shown). The border region is the area where the mask cut 106 will take place (i.e., in FIG. 1B, graphically the mask cut and the border region are the same area, 106). Mask cuts are performed by use of a first and second mask. A first photoresist layer is exposed using the first mask resulting in lines of a material used in semiconductor processing oriented in a first direction. A second photoresist layer is exposed using a second mask, resulting in a space in the material used in semiconductor processing along the location of the mask cut 106.

The use of mask cuts along border regions comprising cell boundaries or in border regions between three or more device gates, as disclosed in the present invention, is a novel concept that offers advantageous results over prior art. Mask cuts have previously been used in either SRAM cells as described in the detailed description. Mask cuts have also been used within random logic standard cells to cut all gates, but create data partition problems. In the present invention the use of mask cuts along the border region reduces the amount of data partitioning required, therefore making the use of mask cuts in random logic feasible.

In integrated chip design, there are two areas that can be specifically identified as areas along or in the vicinity of line ends where design rules are needed to ensure that a design is able to be fabricated, and where the present invention will offer advantages over prior art. These two areas are not inclusive of the areas where design rules are necessary but have been chosen for their relation to the disclosed invention. These two areas are the extension of gate electrode layer over the active region and gate electrode to gate electrode line end spacing.

These two areas are important because of the physical phenomenon that drives the need for design rules to regulate their layout, CD tolerance and line end shortening. In this disclosure, the term line end shortening is meant to include all uncontrolled variation of line ends and the term CD tolerance will only refer to line sides. Also, in FIGS. 2A and 2B the line length is the longer dimension of the shape and the width is the smaller dimension.

Figure 2A:
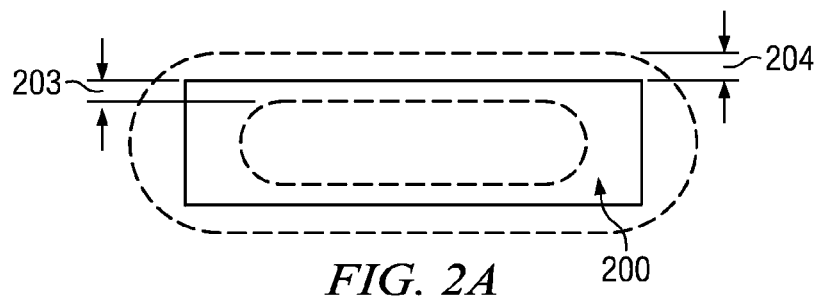
FIG. 2A shows a rectangular metal line and its on-wafer size change due to CD tolerance and corner rounding.

CD tolerance is the uncontrollable variation in line width that occurs during fabrication. It can also be thought of as the ability of lithography and process to control the location at which a line side appears on wafer. For example, FIG. 2A shows a designed metal line and two possible on-wafer implementations of the line. In the figure, the solid line 200 is the location of the designed line and the dashed lines are two possible variations of how the on wafer shape could look due to CD variation and corner rounding of the line. CD tolerance can be positive 204 or negative 203 where the sign denotes whether the shape is larger than intended (positive) or smaller (negative). It has both a lithographic component and an additional component which accounts for all fabrication steps outside of lithography. Given the minimum dimensions in use for emerging technology nodes CD tolerance has an increasingly large impact on design rules and designs.

Figure 2B:
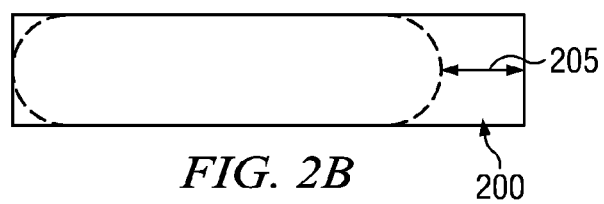
FIG. 2B shows a rectangular metal line and its on-wafer change due to line end shortening and corner rounding.

Line end shortening is a phenomenon which has emerged as a problem in the 90 nm and smaller technology nodes. It is the printing of line ends short of where they are designed. It occurs on thin metal levels and the gate electrode level. FIG. 2B shows a designed line (solid line) 200 and the on-wafer location of the line end (dashed line) due to line end shortening 205 and corner rounding. In some cases proximity correction or other design manipulation can be used to "fix" this problem. For example, optical proximity correction (OPC) may be used to remove line end shortening. However, in situations where a line end abuts a minimum space there is not room for design manipulation to be made to the line end and line end shortening occurs. In general, the variation of line end shortening 205 can run three to four times larger that of line side tolerance 203 and 204.

Figure 3A:
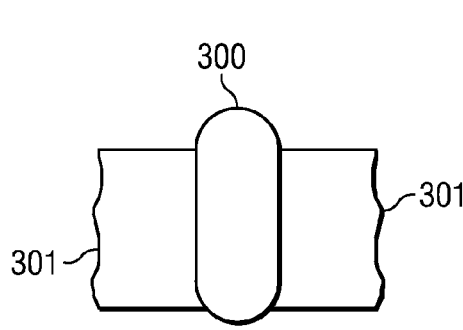
FIG. 3A shows a possible on-wafer implementation of a gate straddling an active region, wherein line end shortening has caused the gate to be pulled back such that the gate length is not uniform along the gate width.

In design, the extension of the gate electrode past the active region is an important consideration because without sufficient gate electrode past active extension line end shortening and corner rounding can pull the line back such an extent that either device leakage occurs, severely compromising the device performance, or a device is rendered totally inoperable. FIG. 3A shows a possible on-wafer implementation of a gate electrode 300 extending over an active region 301, taking into account corner rounding, line end shortening, and CD tolerance. The gate electrode lines, which were long narrow rectangles in design will undergo corner rounding, a change in gate length (i.e., the shorter dimension of the gate, where the gate is the intersection of the gate electrode layer and the active layer) due to CD tolerance, and a change in the gate width (i.e., the longer dimension of the gate) due to line end shortening. The change in the gate width of FIG. 3A has caused the device gate length to be shorter at the bottom of the device than the top, possibly causing device leakage.

Figure 3B:
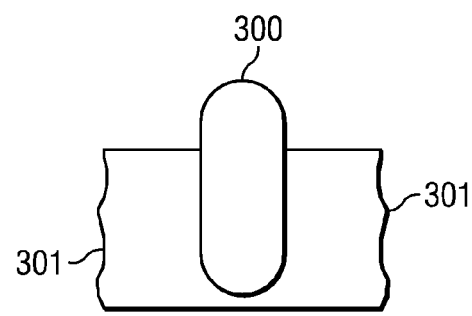
FIG. 3B shows a possible on-wafer implementation a gate straddling an active region, wherein line end shortening has caused the gate to pulled back beyond the active region.

FIG. 3B shows another possible on-wafer implementation where a larger line end tolerance has caused the gate electrode material 300 to be pulled back to such an extent that the gate electrode material 300 no longer straddles the active region 301. If CD tolerance and line end shortening are not controlled situations like this can occur, rendering devices completely inoperable.

Figure 3C:
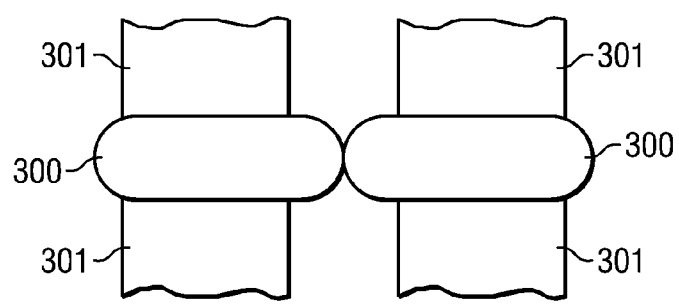
FIG. 3C shows a possible on-wafer implementation of two gate ends at minimum space, wherein line end shortening has caused the gate ends to short.
Figure 4:
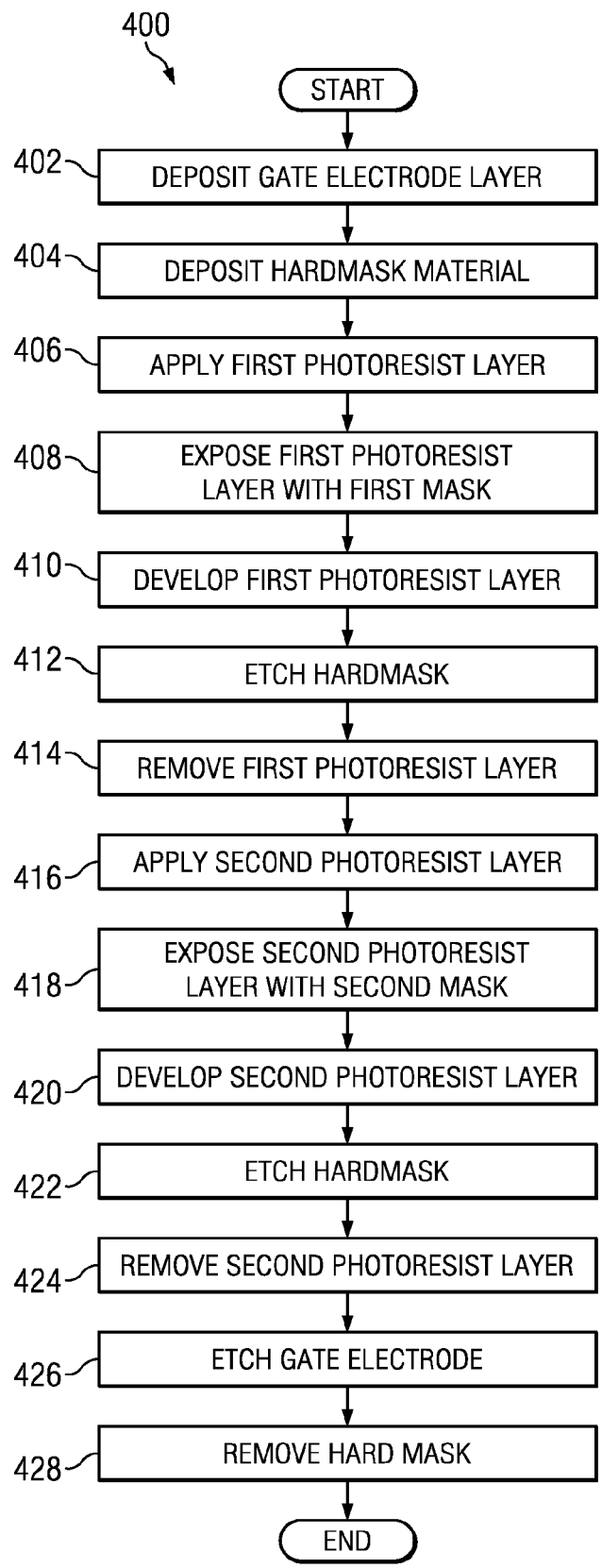
FIG. 4 shows a process flow for a dual mask lithography process for random logic fabrication.
Figure 5:
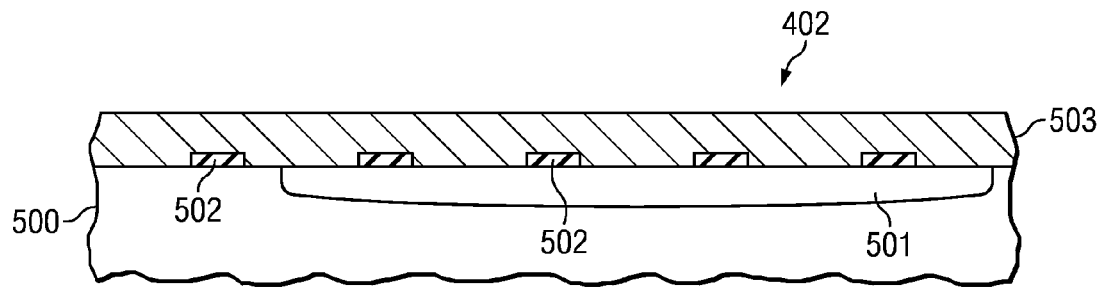
FIGS. 5-7, 8B, 9-12, 13B, and 14-17 are cross-sectional views of a more detailed embodiment of a method for such dual mask lithography.
Figure 6:
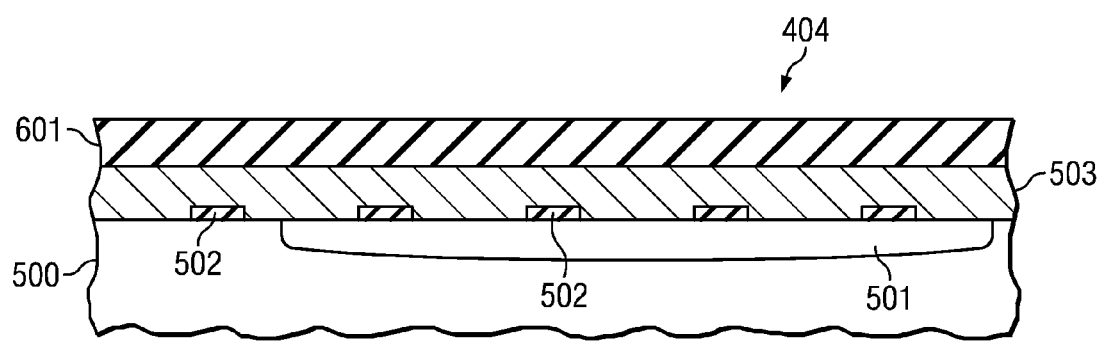
Figure 7:
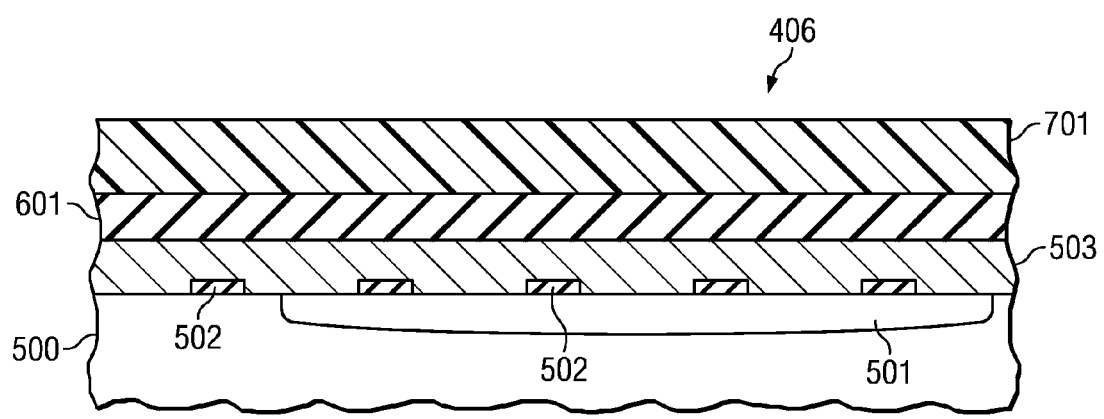

Finally, FIG. 3C shows the space between gate electrode 300 line ends. The distance between line ends is important as line ends getting too close together can either short by physically touching or short by causing a breakdown of the dielectric material separating the line ends. Design rules can be put in place to require larger line end spaces, but such design rules are detrimental to density and are more complicated for routers and other automation tools to implement on back end of the line metallization levels FIG. 4 shows one embodiment of the present invention, a methodology 400 using a two mask lithography process to reduce the space required along a border region. While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Further, the below methodology 400 describes this embodiment as a method by which a hard mask is used as an intermediate step to transfer photoresist patterning to a gate electrode layer. It is well known in the art that the use of a hard mask is not necessary and that photoresist patterns may be directly transferred to the gate electrode material. An alternative embodiment of the present invention not using the hard mask does not require the intermediate steps of transferring each of the patterns into a hard mask and then transferring the hard mask into the gate electrode material.

In the process flow 400 of FIG. 4 a set of two masks is used to expose two layers of photoresist which will pattern a single hard mask. FIGS. 5-17 further illustrate the process flow 400 for a gate electrode layer. The two mask process is not restricted to such a layer. The process can be used for one or more of a gate electrode level, a copper interconnect level, etc. The inventors have contemplated a wide variety of layers to which the invention could be applied. For each layer in which the methodology is used two separate masks are required.

At 402 a gate electrode layer is formed. For example, in FIG. 5 the gate electrode material is deposited onto a substrate which comprises some front end of the line processing. The substrate 500 has been implanted with an active region 501 and covered with a gate dielectric 503. The substrate, as referred to in FIG. 5, may comprise any type of semiconductor body (e.g., silicon, SiGe, SOI) such as a semiconductor wafer or one or more die on a wafer, as well as any other type of semiconductor and/or epitaxial layers formed thereon and/or otherwise associated therewith. Furthermore, the inventors have contemplated additional processing steps and/or different processing steps which may occur prior to the formation of a gate dielectric layer. For situations where the disclosed method is not intended for use with a layer comprising a gate electrode material, this act can be skipped.

At 404 a hard mask material is formed on top of the gate electrode material. The hard mask may be, for example, around 50 to 500 nm thick and, for example, comprises TiAlN, TiN, Ti, TiO$_2$, Al, AlOx, AlN, TiAl, TiAlOx, Ta, TaOx, TaN, Cr, CrN, CrOx, Zr, ZrOx, ZrN, Hf, HfN, HfOx, silicon-rich nitride (SRN), silicon-rich oxynitride (SRON), silicon oxide, low-k dielectric, or any stack or combination thereof. An example of a hard mask stack is 300 nm of PECVD deposited SiO$_2$ on 50 nm of sputter deposited TiAlN or TiN.

The deposition of the hard mask may be a single or multi-layer stack of different materials in order to better control the hard mask profile and remaining hard mask thickness. For example, a hard mask stack is 30 nm of TiAlN on 120 nm of TiAl, which is formed on 20 nm TiAlO which is formed on 50 nm of TiAlN. All of these layers are, for example, deposited by sputter deposition in the same chamber where the film composition is changed during the deposition by varying the gas composition (Ar+N$_2$ (50/50) for nitride, Ar for metal, and Ar+O$_2$ (90/10) or Ar+N$_2$+O$_2$ (85/10/5) for oxide). The TiAlN is, for example, deposited at around 400C with high power to achieve roughly 100 nm/min TiAlN deposition rate. The TiAlN can be replaced by TiN for all of these cases.

At 406 a first layer of photoresist 701 is formed on top of the hard mask 601 material. The first photoresist layer may be formed on the substrate by depositing the photoresist onto the substrate and spinning the substrate at a high speed (e.g., 500-3000 RPM) or a sequence of high speeds resulting in an even distribution of photoresist over the surface of the substrate, for example. Photoresist comes in two tones, positive and negative. Positive photoresist will be structurally weakened when it is exposed and negative photoresist will be structurally strengthened when it is exposed. The disclosed invention is not limited to the use of either positive or negative photoresist, though in FIG. 7 and throughout the disclosure the examples and figures will use a positive photoresist.

Figure 8A:
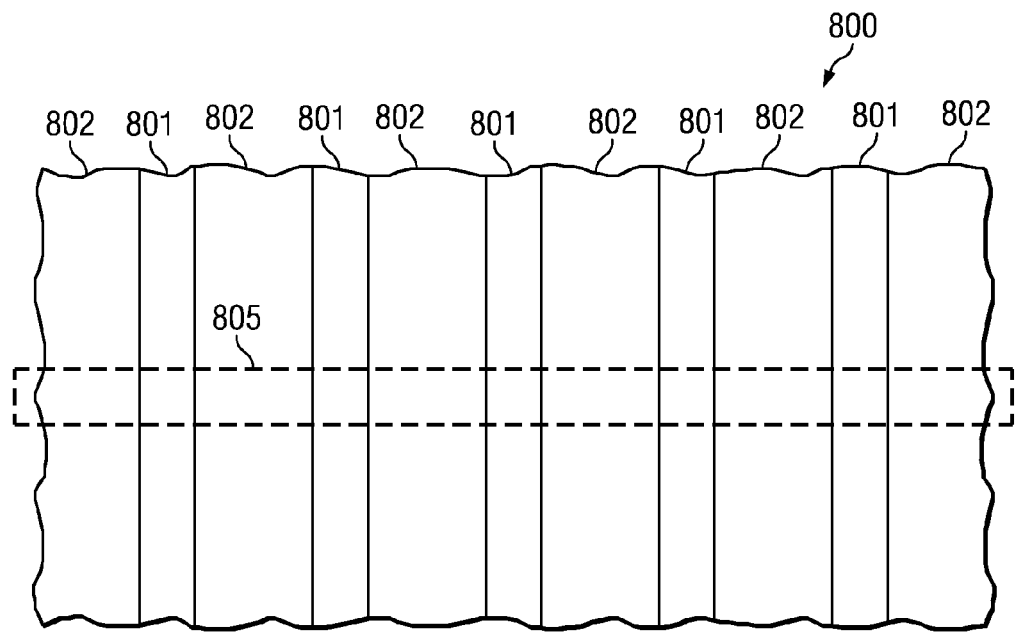
FIGS. 8A and 13A are top views of a section of the chrome masks used in conjunction with FIGS. 8B and 13B, respectively.
Figure 8B:
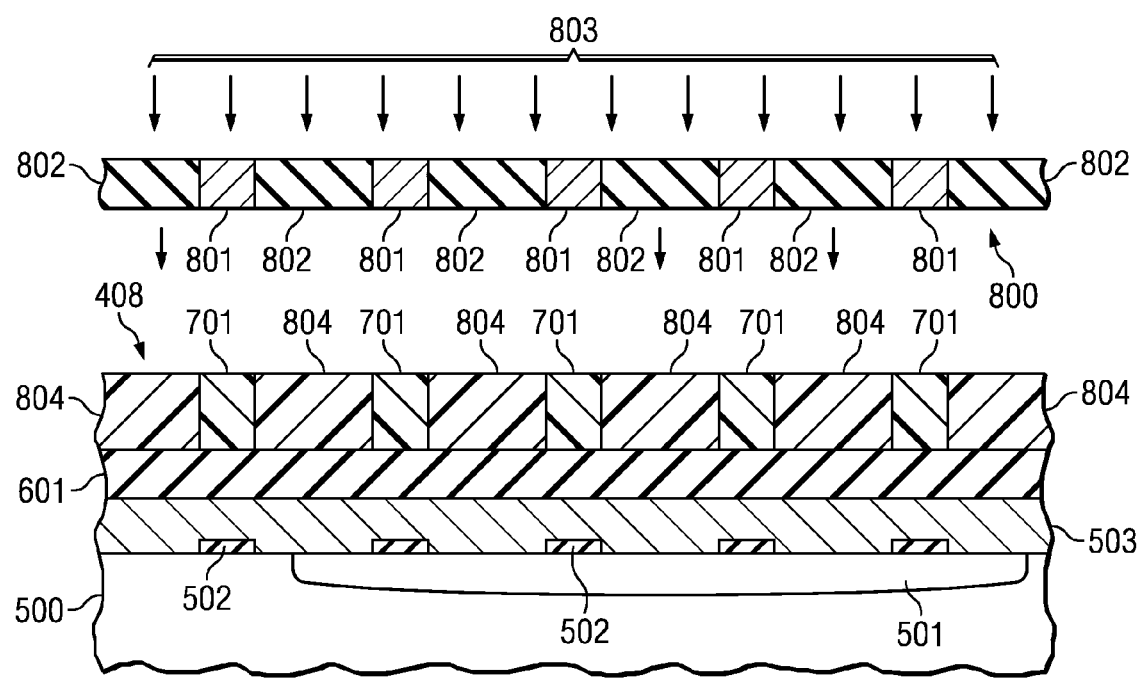

The first photoresist layer 701 is exposed through a first mask at 408. A lithography system will selectively expose the first photoresist layer 701, to a first illumination 803 through a first mask 800 having transmitting and blocking portions 801, 802, resulting in an exposed first photoresist layer 804 that is used to pattern three or more lines of the hard mask layer 601 intersecting opposite edges of a border region 805. FIG. 8A is a top view of an exemplary first mask 800 used in the process. FIG. 8B is a cross-sectional view of the integrated chip. Ultimately, exposure of the first mask 800 will result in the formation of the gate electrodes. The length of the hard mask lines have a dimension encompassing the sum of the length of the gate electrode line above the border region, the length of the gate electrode line below the border region, and the width of the border region. The dose used to expose the photoresist will depend upon the photoresist used.

For simplicity, the masks shown in the figures throughout this disclosure are shown as chrome on glass masks with no design manipulation (e.g., OPC) made to the mask shapes. Therefore, the shapes on the masks are intended to represent the shapes that would be exposed in the photoresist. The inventors have contemplated a wide variety of masks that may be used with the invention including but not limited to alternating phase shift masks, CPL masks, embedded attenuated phase-shift masks, and attenuating phase shift masks. The disclosed invention can also be applied to any type of mask.

Figure 9:
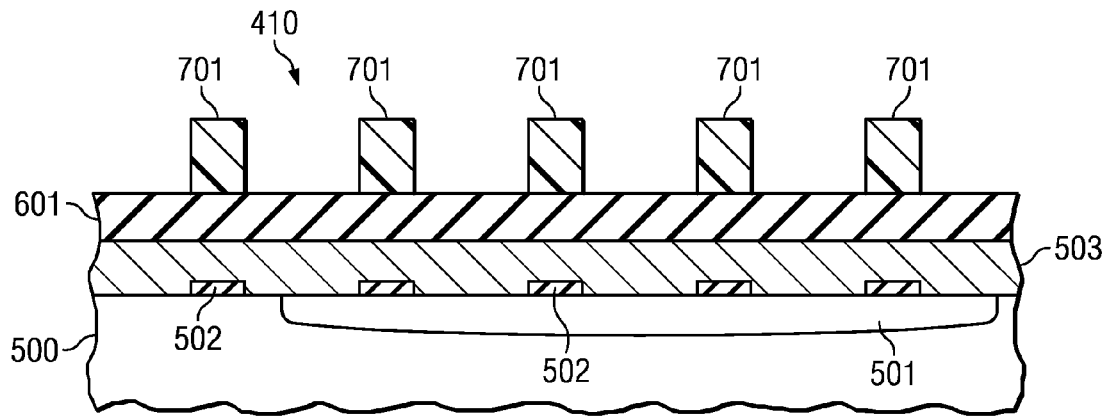
Figure 10:
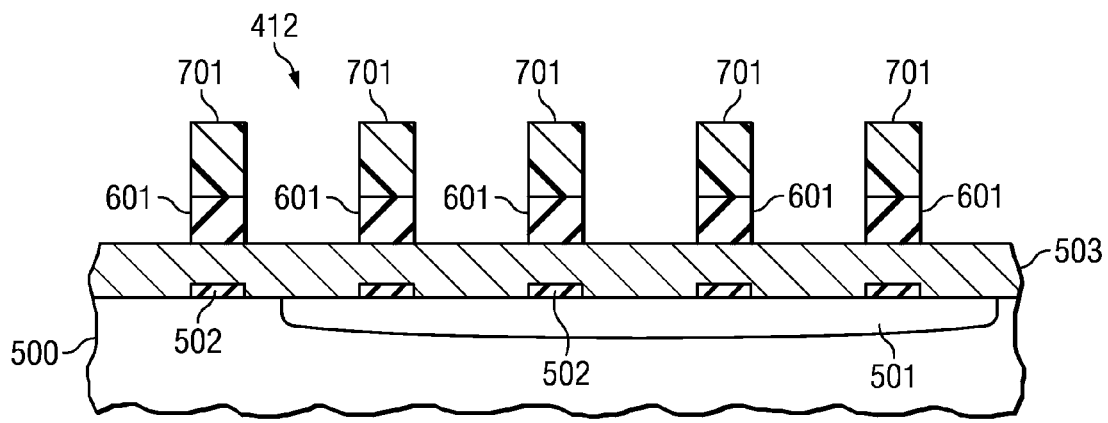
Figure 11:
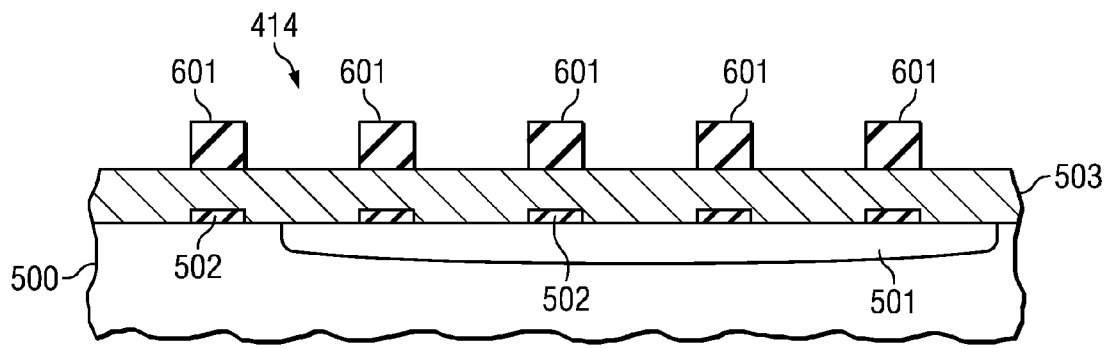
Figure 12:
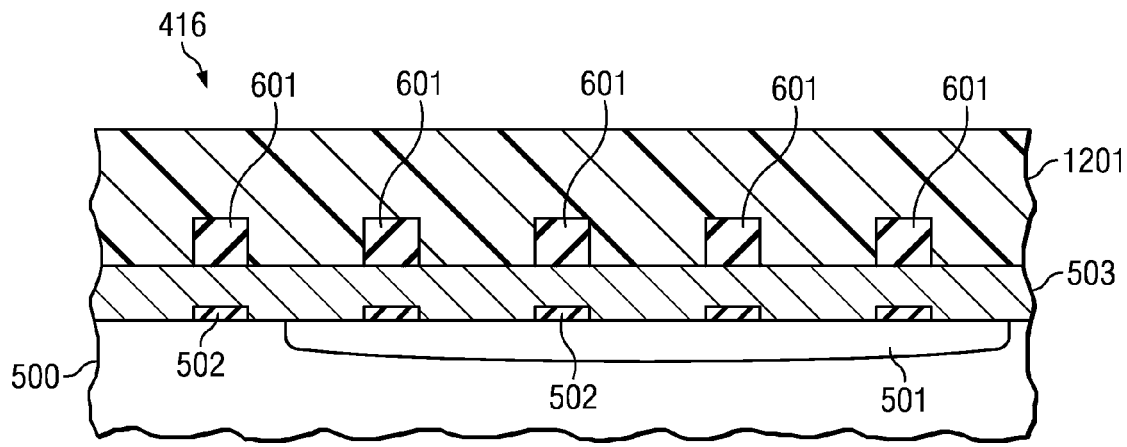

At 410 the first photoresist 701 is developed. FIG. 9 shows the exposed parts of the positive photoresist 804 removed, exposing the hard mask 601 below.

At 412 the hard mask 601 is etched away to expose the gate electrode layer 503 beneath. The etchant used for hard mask etching may vary depending on the material used for the hard mask. Reactive ion etching is often used for hard mask etching. For example, a TiAlN hard mask may be effectively etched using plasma made from a mixture of $Cl_2$ and $BCl_3$ in a cold substrate process or any other suitable etch process for etching TiAlN.

The first layer of photoresist 701 is removed from the hard mask 601 at 414. The first layer of photoresist may be stripped using a plasma system or using an aqueous cleaning solution. For a plasma system, an inert gas such as Argon or Oxygen may be used to form the plasma for stripping. If an aqueous cleaning solution is used, the solution may be a chemical mixture comprising the principal ingredients Choline and Monoethanolamine (MEA), for example.

A second layer of photoresist 1201 is then formed on the hard mask 601 at 416. At 418 the second photoresist layer 1201 is selectively exposed by a second illumination 1303 through a second mask 1300 having transmitting and blocking portions 1301, 1302, resulting in a pattern of exposed second photoresist 1304 that forms an opening in the hard mask layer 603 along the border region 805. The minimum opening that will be produced by the second mask is substantially three times the minimum contacted pitch of the gates. The minimum contacted pitch may vary depending on the technology node. Minimum contacted pitch is dependent upon the "critical dimension" of a technology, wherein the "critical dimension" is generally considered to be the minimum gate length (i.e., dimension in the channel carrier flow direction) being employed for a particular device. Devices formed by the methods of the present application can have any suitable critical dimensions. For example, the devices can have critical dimension of about 100 nm or less, such as, for example, about 45 nm, or about 32 nm, about 22 nm, or less. The use of some minimal critical dimension object is common in the semiconductor industry for describing different generations of integrated circuits. The features of such integrated circuits generally approximately track or "scale with" these minimum features.

Figure 13A:
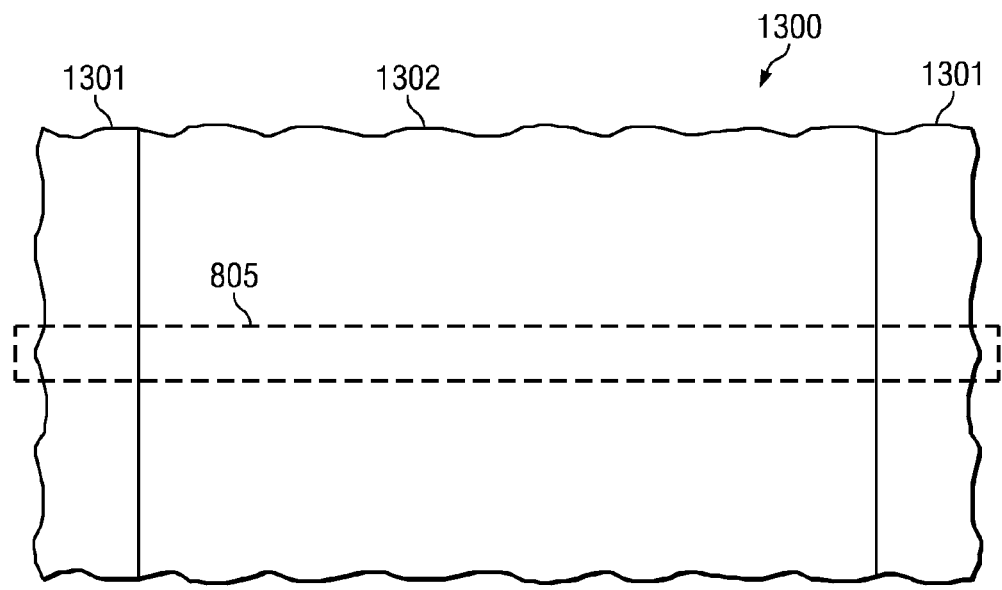
Figure 13B:
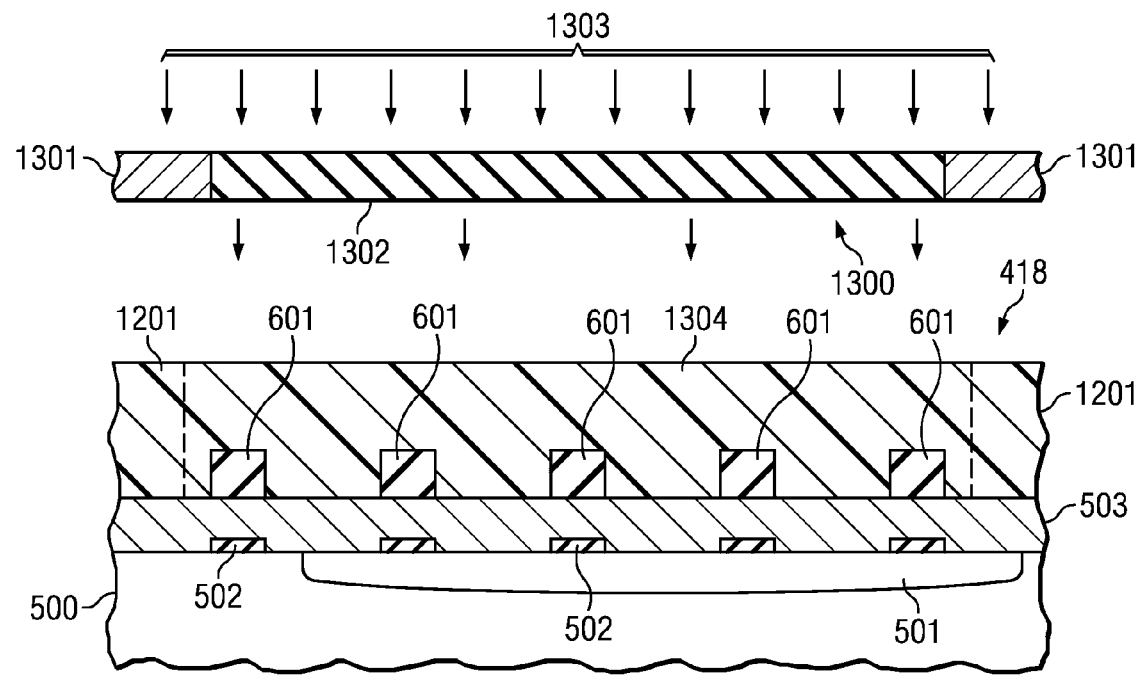
Figure 14:
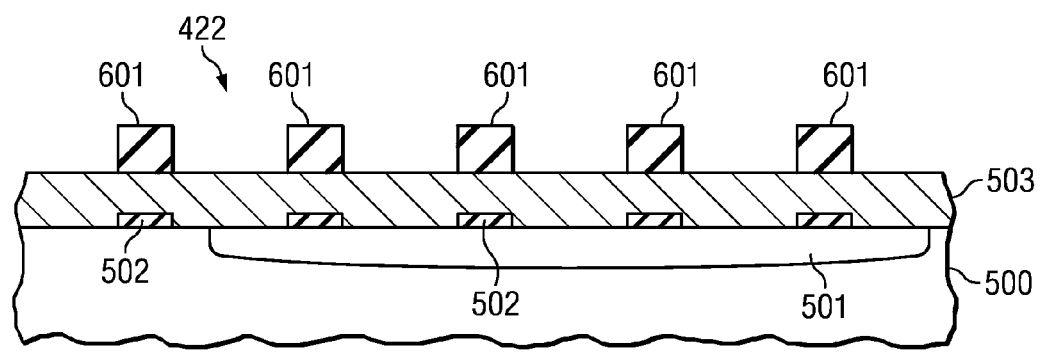

Ultimately, exposure of the second mask 1300 will result in a space in the gate electrode material 503 along the border region 805. The opening of the hard mask will ultimately result in the removal of the conductive layer, forming two distinct sets of three or more gate electrode lines electrically separated from each other. In a specific embodiment, the space formed in the hard mask layer as a result of the second mask exposure is substantially perpendicular to the lines of hard mask material resulting from the first mask exposure. FIG. 13A shows part of exemplary mask that may be used in conjunction with the mask of FIG. 8A.

In current art, a two mask process is used in formation of logic gates. Certain processes will use a first mask to form all random logic and long strips of gate material for the SRAM gates. A second mask is then used to cut apart the long strips of gate material and form the SRAM gates. Other processes will use a first mask to form long strips of gate material for the random logic and SRAM gates. A second mask is then used to cut apart the long strips of gate material and forms the all random logic and SRAM gates. This latter method requires a substantial investment into data partitioning and proximity correction control. In the disclosed invention, the dual mask method 400 uses the same number of lithography steps per level formed, the second step comprises random logic circuit patterning as well as SRAM patterning.

The second photoresist layer 1201 is developed at 420. Development of the second photoresist 1201 will remove the weaker area from the substrate 501. For a positive photoresist, as in FIG. 14A-14B, the exposed photoresist will be removed from the substrate upon development. For a negative photoresist, the non-exposed photoresist would be removed from the substrate upon development.

At 422 the hard mask layer 601 is etched again such that the hard mask 601 only remains over areas where the gate electrode lines 503 are designed to be located. The second layer of exposed photoresist 1304 is removed at 424.

Figure 15:
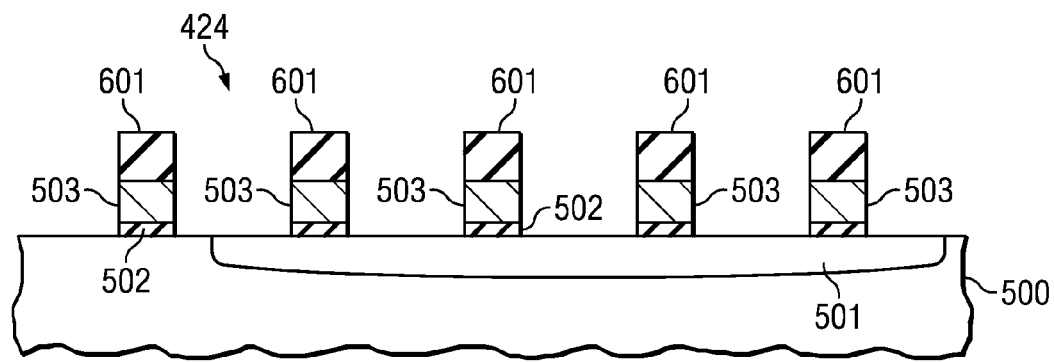

At 426 the gate electrode material 503 is selectively etched away in areas not covered by hard mask 601. In FIG. 15, by selectively etching away the gate electrode 503 above the gate dielectric 502 the remaining gate dielectric 502 and gate electrode 503 form a gate.

Figure 16:
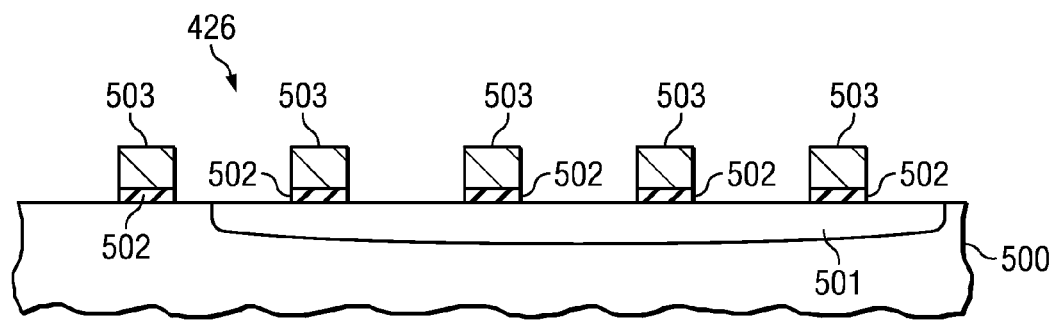
Figure 17:
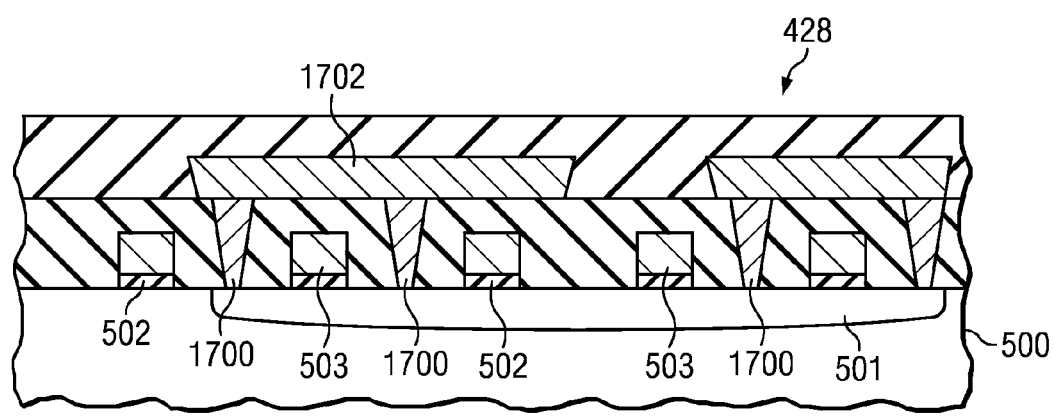

The remaining hard mask 601 is removed at 428. This leaves the exposed gates, as shown in FIG. 16. The exposed gates can be connected to the metal interconnect level by contacts in subsequent steps.

Figure 18A:
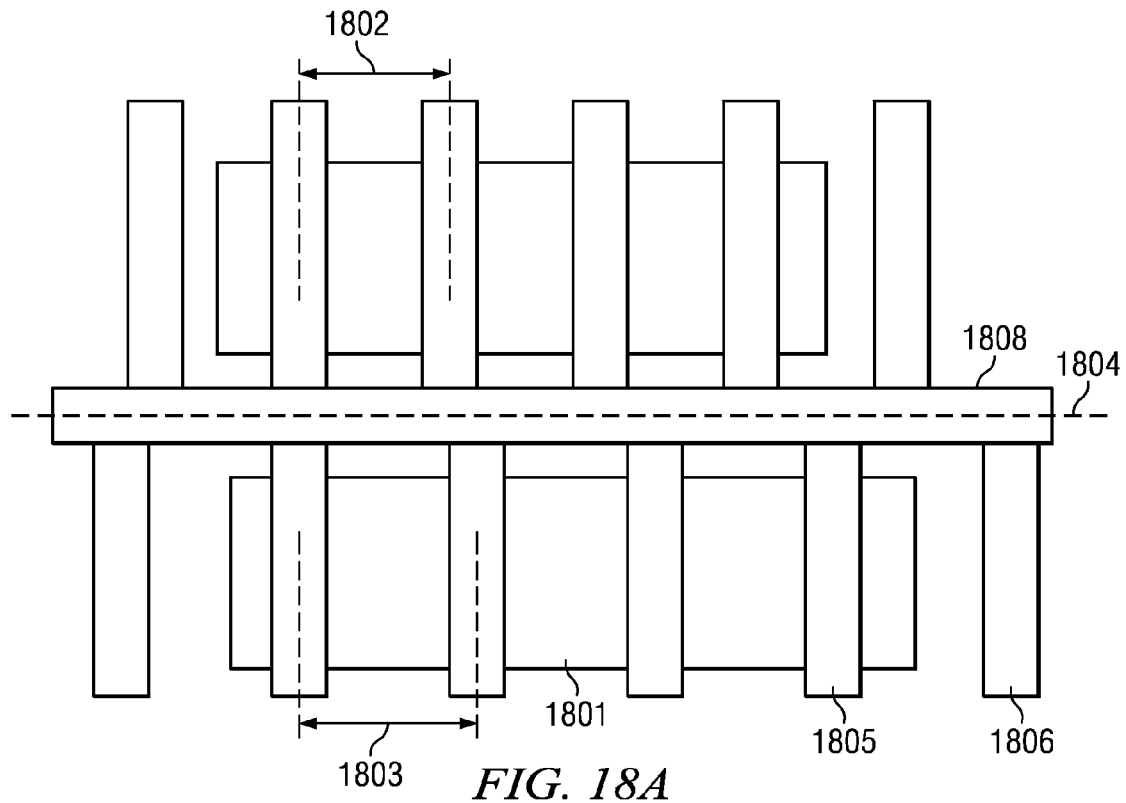
FIG. 18A shows gates with pitch A above a cell boundary and gates with a different pitch B below the cell boundary.
Figure 18B:
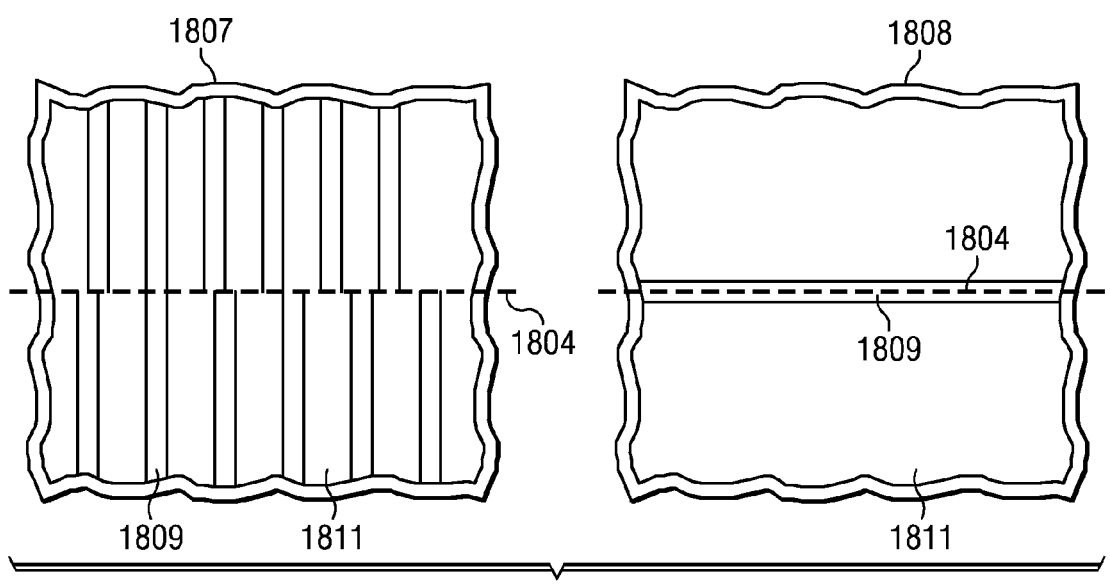
FIG. 18B shows sections of two chrome mask set for exposing the gate electrode of FIG. 18A.

Referring now to FIG. 18A shows a simple gate layout over an active region with dummy gate lines. Dummy gate lines (i.e., dummy poly lines) refer to dummy design shapes located on the gate electrode design layer which are not formed over the active region but which offer lithographic support essential for adjacent gate CD control. FIG. 18B shows a two mask system that is one embodiment of the disclosed invention. The first mask 1807 comprises openings 1809 and blocking portions 1811 which when subjected to illumination from a lithography system will expose the photoresist such that subsequent processing will form three or more gate electrode lines 1805, three or more dummy gate lines 1806, or a combination of three or more gate electrode lines 1805 and dummy gate lines 1806 above and below the border region 1808 comprising the cell boundary 1804 of FIG. 18A. The second mask 1808 comprises openings 1809 which when subjected to illumination from a lithography system will expose the photoresist such that a space will be formed between the gate electrode/dummy gate lines along the border region 1808 comprising the cell boundary 1804. In this embodiment, the masks of FIG. 18B will not have the data partition problem that is usually associated with random logic circuits since the "trimming" is done along a sufficiently large length of the cell boundary 1804.

FIG. 18B shows a two mask set which could be used to form the structure of FIG. 18A. By using the set of masks of FIG. 18B, the problems of FIGS. 3A-3C are alleviated. Sufficient gate extension past the active region (e.g., FIGS. 3A and 3B) is no longer a concern since the gate electrode lines 1805 on both sides of a cell boundary 1804 can now extend from the edge of the active region 1801 to the cell boundary 1801. The second, "trim" mask will make a space between the line ends substantially equal to the minimum space defined by design rules. The tolerance of the line end resulting from the trimming of the second mask is the tolerance of a slot side rather than a line end and therefore is not as large as in the case of a single mask exposure. Similarly, the line end spacing (e.g., FIG. 3C) is no longer a concern, since the line ends are formed by the edge of a slot side from the second mask exposure, therefore reducing the resulting on-wafer line end pullback to be that of a line side CD tolerance.

FIGS. 18A and 18B illustrate another aspect of the present invention, embodiments comprising variations of the pitch of the conductive lines formed by the first mask on opposite sides of the border region. FIG. 18A shows gate electrode 1805 and dummy gate 1806 lines above the border region 1808 with a pitch of 1802, while gate electrode 1805 and dummy gate 1806 lines below the border region 1808 have a larger pitch of 1803. In terms of pitch, there are three design options by which gates and dummy gate may be laid out: on grid, substantially on grid, or not on grid.

If the gates and dummy gates are on grid, the design space of the integrated chip layout will comprise a standard grid and gates and dummy gates will only have the option of being placed on the standard grid. In this situation the gates and dummy gates will be aligned across the border region. If the gates and dummy gates are substantially on grid, the gates and dummy gates are allowed to be placed within a certain threshold of a design grid line. For example, using a threshold of 15 nm, a gate would be substantially on grid if the centerline of the gate was within 15 nm of the design grid line. Gates and dummy gates which are substantially on grid will be substantially aligned across the border region. Finally, the gates and dummy gates may be not on grid. Gates and dummy gates which are designed without a design grid are especially common in older technologies, wherein lithography conditions did not require gridded layout. Gates and dummy gates which are not on grid will require a larger border region since the gates may be misaligned over the border region. In emerging technologies gridding is becoming more common, especially in the design of gates requiring tight performance control.

The invention of this disclosure may apply to conductive lines with any of these three types of pitch, and the two mask method shown in FIG. 4 may be used for any such fabrication. Further, the embodiments shown in FIGS. 18A and 18B is not necessarily restricted to the gate electrode layer. The inventors have contemplated the use of this embodiment on any layer used in the processing of an integrated chip (e.g., metal interconnect layers).

Figure 19A:
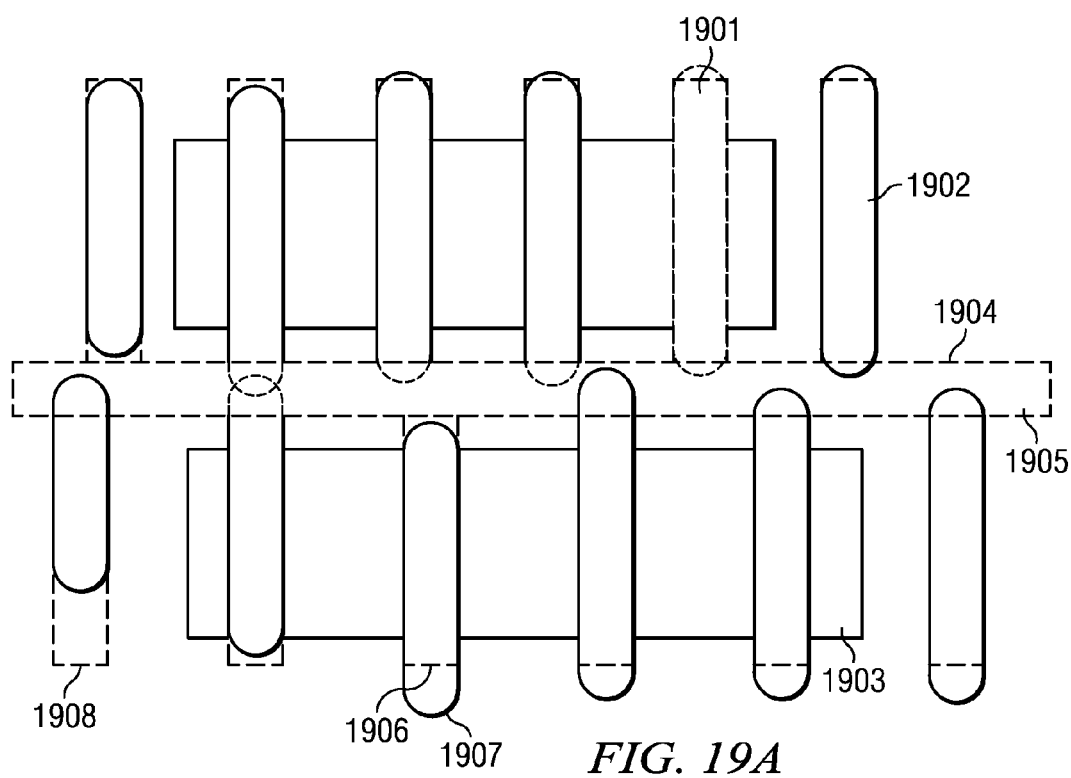
FIG. 19A shows the on-wafer implementation of the first mask of set 18B and an overlay of the effect of the second mask.
Figure 19B:
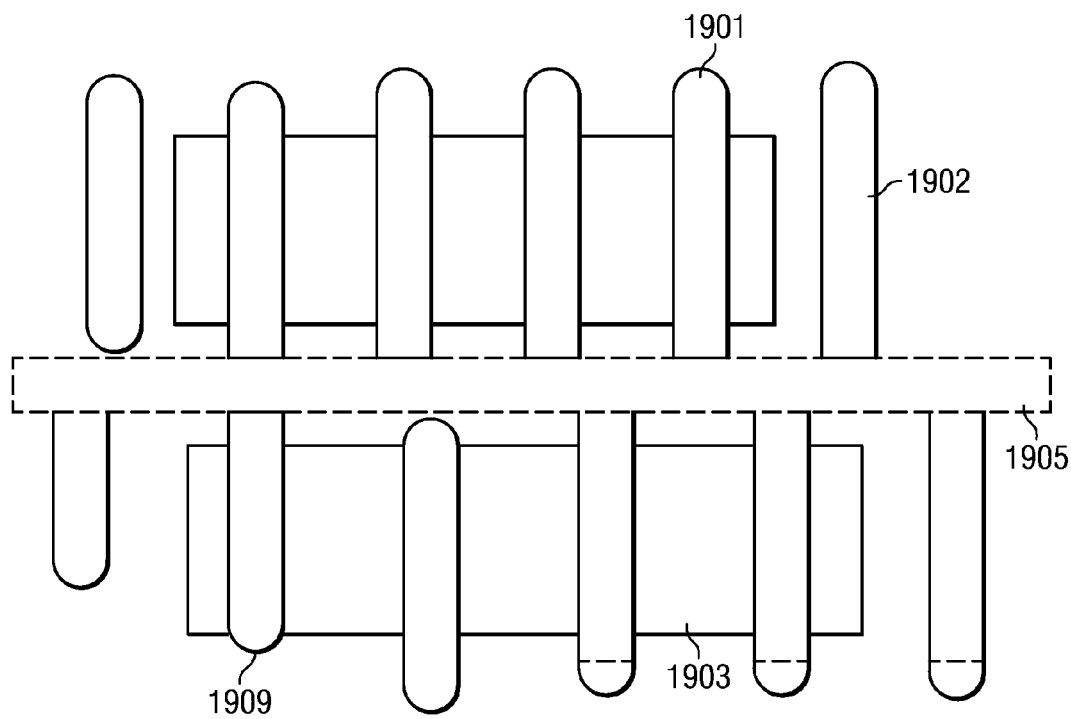
FIG. 19B shows the final on-wafer implementation of both the first and second mask set of FIG. 18B.

FIGS. 19A and 19B show how line end shortening is effectively removed from line ends formed by the embodiments of this invention. FIG. 19A shows a combination of the designed gates 1906 (dashed line), designed dummy gates 1908 (dashed line), a possible location of the hard mask 1907 after the first mask development and etch (taking into account line side CD tolerance, corner rounding, and line end shortening), and the location that will be opened in the hard mask 1904 by development of the second mask and subsequent etching. As shown in FIG. 19A, in some cases the hard mask left after the first mask exposure and subsequent etch will merge and in other locations it will not. Once the second mask is exposed and the hard mask in the border region is etched away, we are left with on-wafer gate electrode material 1901 and dummy gate 1902 as shown in FIG. 19B. As previously stated, due to the extension of the gate electrode 1901 past the active region 1902 to the cell boundary and reduced line end shortening there will be no cases of insufficient gate electrode past gate extension. Due to the trimming associated with the second mask, there are no situations of shorting between the gate electrode material 1901 or between the dummy gate material 1902. FIGS. 19A and 19B show only an example of a simple layout. Other exemplary layouts where the invention of this disclosure are applicable may involve different combinations of gates and dummy gate, so long as there are three or more adjacent gates and/or dummy gates. For example, certain layouts may gave dummy gates fitted between the gates.

It can also be seen from FIGS. 19A and 19B that gate electrode line ends and dummy gate line ends can be allowed to touch each other either physically or can be spaced at a distance less than the minimum groundrule spacing of the gate electrode level. In either case, the second mask will trim along the border region, removing conductive material from the border region and reducing the line length of the gate electrode or dummy gate lines.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating an integrated circuit chip including random logic circuits, comprising:

providing a semiconductor substrate defining a first active region of a first random logic cell separated by an intervening border region from a second active region of a second random logic cell;

forming a layer of gate electrode material over the first active region, the second active region and the border region;

forming a layer of hard mask material over the layer of gate electrode material;

forming a first layer of photoresist material over the layer of hard mask material;

patterning the first layer of photoresist material by selective exposure through a first mask to define a gate electrode line pattern;

selectively etching the layer of hard mask material using the gate electrode pattern, resulting in formation of at least three elongated gate electrode structures, the elongation of each gate electrode extending in a direction across the first active region, the intervening border region and the second active region;

removing the patterned first layer of photoresist material;

forming a second layer of photoresist material over the layer of hard mask material;

patterning the second layer of photoresist material by selective exposure through a second mask to define a trim pattern;

selectively etching the layer of hard mask material using the trim pattern, resulting in formation of a space extending transversely to the direction of elongation and removing portions of the gate electrode structures extending across the border region, to provide a composite pattern that redefines the gate electrode structures into distinct sets of gate electrodes, a first set extending across the first active region and terminating in a border region extension directed toward the second cell and a second set extending across the second active region and terminating in a border region extension directed toward the first cell; and transferring the composite pattern to the layer of gate electrode material.

2. The method of claim 1, wherein selectively etching using the gate electrode pattern also results in formation of dummy gate electrode structures; and selectively etching using the trim pattern also results in removing portions of the dummy gate electrode structures to redefine the dummy gate electrode structures into distinct sets of dummy gate electrodes.

3. The method of claim 1, wherein the at least three elongated gate electrode structures are spaced by a pitch in a gate electrode length critical dimension direction; and the transversely extending space extends by at least three times the pitch in the gate electrode length critical dimension.

4. The method of claim 1, wherein respective ones of the gate electrodes of the first set have centerlines aligned with corresponding respective ones of the gate electrodes of the second set.

5. The method of claim 4, wherein the gate electrode structures are rectangular structures with widths equal to a gate electrode length critical dimension.

6. The method of claim 5, wherein the space formed by the trim pattern sets a spacing between border region extensions of corresponding respective ones of the gate electrodes of the first and second sets equal to a minimum spacing defined by design rules.

7. A method of fabricating an integrated circuit chip including random logic circuits, comprising:

providing a semiconductor substrate defining a first active region of a first random logic cell separated by an intervening border region from a second active region of a second random logic cell;

forming a layer of gate electrode material over the first active region, the second active region and the border region;

forming a first layer of photoresist material over the layer of gate electrode material;

patterning the first layer of photoresist material by selective exposure through a first mask to define a gate electrode line pattern;

selectively etching the layer of gate electrode material using the gate electrode pattern, resulting in formation of at least three elongated gate electrode structures, the elongation of each gate electrode extending in a direction across the first active region, the intervening border region and the second active region;

removing the patterned first layer of photoresist material;

forming a second layer of photoresist material over the layer of gate electrode material;

patterning the second layer of photoresist material by selective exposure through a second mask to define a trim pattern; and selectively etching the layer of gate electrode material using the trim pattern, resulting in formation of a space extending transversely to the direction of elongation and removing portions of the gate electrode structures extending across the border region, to provide a composite pattern that redefines the gate electrode structures into distinct sets of gate electrodes, a first set extending across the first active region and terminating in a border region extension directed toward the second cell and a second set extending across the second active region and terminating in a border region extension directed toward the first cell.

\* \* \* \* \*